(12) United States Patent
Jongman et al.

(10) Patent No.: US 11,676,888 B2
(45) Date of Patent: Jun. 13, 2023

(54) SEMICONDUCTOR DEVICES

(71) Applicant: Flexenable Limited, Cambridge (GB)

(72) Inventors: Jan Jongman, Cambridge (GB);
Joffrey Dury, Cambridge (GB)

(73) Assignee: Flexenable Technology Limited, Cambridge (GB)

( * ) Notice: Subject to any disclaimer, the term of this patent is extended or adjusted under 35 U.S.C. 154(b) by 128 days.

(21) Appl. No.: 16/900,646

(22) Filed: Jun. 12, 2020

(65) Prior Publication Data

US 2020/0402898 A1    Dec. 24, 2020

(30) Foreign Application Priority Data

Jun. 20, 2019 (GB) ..................... 1908876

(51) Int. Cl.
*H01L 23/48* (2006.01)
*H01L 23/498* (2006.01)
*H01L 23/522* (2006.01)
*H01L 23/528* (2006.01)

(52) U.S. Cl.
CPC ...... *H01L 23/49822* (2013.01); *H01L 23/528* (2013.01); *H01L 23/5226* (2013.01)

(58) Field of Classification Search
CPC ........... H01L 23/49822; H01L 23/5226; H01L 23/528
See application file for complete search history.

(56) References Cited

U.S. PATENT DOCUMENTS

| 9,620,501 | B1* | 4/2017 | Ellinger | ............ H01L 29/78696 |
| 2010/0009497 | A1* | 1/2010 | Dimmler | ............ H01L 51/0005 |
| | | | | 257/E51.006 |
| 2011/0012097 | A1 | 1/2011 | Yoneya | |

(Continued)

FOREIGN PATENT DOCUMENTS

| CN | 105954322 A | 9/2016 |
| GB | 2567873 A | 5/2019 |

OTHER PUBLICATIONS

Search Report from Great Britain Patent Application No. 1908876.4, dated Dec. 12, 2019.

(Continued)

*Primary Examiner* — Nicholas J Tobergte
(74) *Attorney, Agent, or Firm* — Dergosits & Noah LLP; Todd A. Noah

(57) ABSTRACT

A device including a stack of layers defining a first conductor pattern at a first level of the stack and one or more semiconductor channels in respective regions, connecting a pair of parts of the first conductor pattern, and capacitively coupled via a dielectric to a coupling conductor of a second conductor pattern at a second level of the stack. The stack includes at least two insulator patterns over which the first level or second level conductor patterns is formed. A first insulator pattern occupies one or more semiconductor channel regions to provide the dielectric. The second insulator pattern defines one or more windows in the one or more semiconductor channel regions through which the second conductor pattern contacts the first insulator pattern other than via the second insulator pattern. The second insulator pattern overlaps the first insulator pattern outside the one or more semiconductor channel regions.

17 Claims, 8 Drawing Sheets

(56) References Cited

U.S. PATENT DOCUMENTS

| | | |
|---|---|---|
| 2015/0228903 A1 | 8/2015 | Backlund et al. |
| 2016/0254467 A1 | 9/2016 | Fong et al. |
| 2018/0182986 A1 | 6/2018 | Liu |
| 2020/0020724 A1* | 1/2020 | Yaglioglu ............. G02F 1/1368 |

OTHER PUBLICATIONS

Search Report from Great Britain Patent Application No. 2009381.1, dated Dec. 2, 2020.

\* cited by examiner

SEMICONDUCTOR DEVICES

CLAIM OF PRIORITY

This application claims priority to Great Britain Patent Application No. 1908876.4, filed Jun. 20, 2019, the content of which is hereby incorporated by reference in its entirety.

FIELD OF THE INVENTION

Semiconductor devices may comprise a stack of layers defining at least two conductor patterns at two levels of the stack, and one or more semiconductor channels each connecting parts of one of the conductor patterns, and each capacitively coupled to a conductor of the other conductor pattern.

Conventionally, the upper of the two conductor patterns is formed on the surface of a continuous insulator layer of the stack.

The inventor for the present application has invented a technique for facilitating an improvement in the performance and/or stability of such semiconductor devices.

There is hereby provided a device, comprising: a stack of layers defining at least: a first conductor pattern at a first level of the stack; and one or more semiconductor channels in respective semiconductor channel regions, connecting a pair of parts of the first conductor pattern, and capacitively coupled via a dielectric to a coupling conductor of a second conductor pattern at a second level of the stack; wherein the stack comprises: at least two insulator patterns over which the first level conductor pattern or the second level conductor pattern is formed; wherein a first insulator pattern of the at least two insulator patterns occupies at least the one or more semiconductor channel regions to provide the dielectric; and a second insulator pattern of the at least two insulator patterns defines one or more windows in at least the one or more semiconductor channel regions through which the second conductor pattern contacts said first insulator pattern other than via the second insulator pattern; wherein the second insulator pattern overlaps the first insulator pattern outside the one or more semiconductor channel regions.

According to one embodiment, the second level conductor pattern is formed over the at least two insulator patterns; and the coupling conductor of the second level conductor pattern is formed at least over the whole area of the first insulator pattern.

According to one embodiment, the one or more windows extends over at least the whole area of the respective semiconductor channel region.

According to one embodiment, the first insulator pattern comprises a stack of insulator layers.

According to one embodiment, the second conductor pattern defines an array of gate conductors, providing the gate electrode for a respective column of the array of transistors, and extending also over the second insulator pattern.

According to one embodiment, the gate conductors adhere better to the surface of the second insulator pattern than to the surface of the first insulator pattern.

According to one embodiment, a semiconductor pattern provides the semiconductor channels, and the semiconductor pattern matches the first insulator pattern.

There is also hereby provided a method comprising: forming a first conductor pattern; forming at least two insulator patterns over the first conductor pattern; forming a second conductor pattern over the at least two insulator patterns; wherein a first insulator pattern of the at least two insulator patterns occupies at least one or more semiconductor channel regions to provide a dielectric between one or more semiconductor channels and one or more conductors of one of the first and second conductor patterns; and wherein the method comprises forming a second insulator pattern of the at least two insulator patterns after forming the first insulator pattern, wherein the second insulator pattern defines windows in at least the one or more semiconductor channel regions through which the second conductor pattern contacts the first insulator pattern other than via the second insulator pattern.

According to one embodiment, the method comprises providing a third conductor pattern selectively over the first insulator pattern, and wherein the second conductor pattern is formed over the first insulator pattern via the third conductor pattern, and contacts the first insulator pattern via the third conductor pattern.

According to one embodiment, the second insulator pattern overlaps the first insulator pattern outside the one or more semiconductor channel regions.

According to one embodiment, the first insulator pattern provides a dielectric between the one or more semiconductor channels and one or more conductors of the second conductor pattern, and the one or more conductors of the second level conductor pattern is formed at least over the whole area of the first insulator pattern.

According to one embodiment, forming the second conductor pattern comprises patterning one or more conductor layers in situ on the surface defined together by the at least two insulator patterns using one or more patterning agents; wherein the second insulator pattern comprises an insulator material that is less susceptible than one or more insulator materials constituting the first insulator pattern to surface roughening by the one or more patterning agents and/or less permeable than one or more insulator materials constituting the first insulator pattern to the one or more patterning agents.

According to one embodiment, the one or more windows extend over at least the whole area of the respective semiconductor channel regions.

According to one embodiment, the first insulator pattern comprises a stack of insulator layers.

According to one embodiment, the second conductor pattern defines an array of gate conductors, providing the gate electrodes for respective columns of the array of transistors, and extending also over the second insulator pattern.

According to one embodiment, the gate conductors exhibit better adhesion to the surface of the second insulator pattern than to the surface of the first insulator pattern.

According to one embodiment, the method comprises forming a semiconductor pattern over the first conductor pattern to provide the semiconductor channels, and wherein the semiconductor pattern matches the first insulator pattern.

There is also hereby provided a device comprising a stack of layers defining one or more electronic elements, wherein the stack comprises at least: one or more semiconductor channels; a dielectric; a first conductor pattern defining one or more coupling conductors, wherein the one or more coupling conductors are capacitively coupled to the one or one or more semiconductor channels via the dielectric; a planarisation layer; a second conductor pattern defining one or more routing conductors, wherein the second conductor pattern is in contact with the first conductor pattern via through holes in at least the planarisation layer.

There is also hereby provided a method, comprising: forming at least a semiconductor, a dielectric, and a first conductor pattern on a support substrate, wherein the semiconductor defines one or more semiconductor channels capacitively coupled via the dielectric to one or more coupling conductors of the first conductor pattern; forming a planarisation layer on the support substrate; forming through holes in at least the planarisation layer; and forming a routing conductor layer on the support substrate, and etching the routing conductor layer to define a second, routing conductor pattern in contact with the first conductor pattern via the one or more through holes.

There is also hereby provided a device, comprising: a stack of layers defining at least: a first conductor pattern at a first level of the stack; and one or more semiconductor channels in respective semiconductor channel regions, each semiconductor channel connecting a pair of parts of the first conductor pattern, and each semiconductor channel capacitively coupled via a dielectric to a coupling conductor of a second conductor pattern at a second level of the stack; wherein the stack comprises: at least two insulator patterns over which said first level conductor pattern or said second level conductor pattern is formed; wherein a first insulator pattern of the at least two insulator patterns occupies at least the one or more semiconductor channel regions to provide said dielectric; and a second insulator pattern of the at least two insulator patterns defines one or more windows in at least the one or more semiconductor channel regions through which said second conductor pattern contacts said first insulator pattern other than via said second insulator pattern.

There is also hereby provided a method comprising: forming a first conductor pattern; forming at least two insulator patterns over said first conductor pattern; forming a second conductor pattern over said at least two insulator patterns; wherein a first insulator pattern of the at least two insulator patterns occupies at least the one or more semiconductor channel regions to provide a dielectric between the one or more semiconductor channels and one or more conductors of one of the first and second conductor patterns; and wherein a second insulator pattern of the at least two insulator patterns defines windows in at least the semiconductor channel regions through which said second conductor pattern contacts said first insulator pattern other than via said second insulator pattern.

BRIEF DESCRIPTION OF THE FIGURES

Embodiments of the invention is described in detail hereunder, by way of example only, with reference to the accompanying drawings, in which.

DETAILED DESCRIPTION

In one example embodiment, the technique is used for the production of an organic liquid crystal display (OLCD) device, which comprises an organic transistor device (such as an organic thin film transistor (OTFT) device) for the control component. OTFTs comprise an organic semiconductor (such as e.g., an organic polymer or small-molecule semiconductor) for the semiconductor channels.

The terms "row" and "column" are used below to indicate a substantially orthogonal pair of directions, without indicating any absolute direction.

An embodiment of a technique according to an embodiment of the present invention is described in detail below for the example of a thin-film-transistor (TFT) array for the control component of a fringe field switching (FFS) liquid crystal device, but the technique is also applicable, for example, to top-gate TFTs or bottom-gate TFTs for any kind of semiconductor device, including e.g.: the control component for other types of liquid crystal display devices (LCDs); the control component for other kinds of display devices such as electrophoretic display devices (EPDs); electrical circuitry for sensor devices; and electrical circuitry for logic devices.

For simplicity of explanation, FIGS. 1-11 show only four semiconductor channels, but a semiconductor device may comprise a very large number of semiconductor channels.

Figure 1:
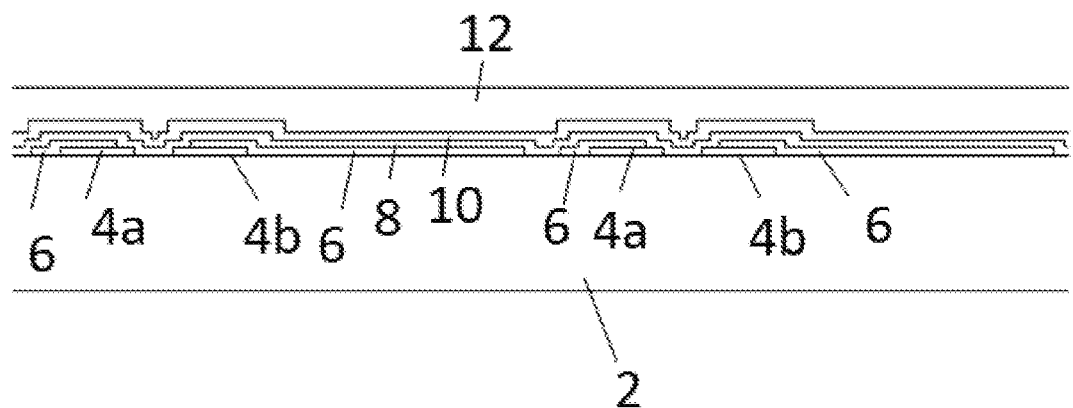
FIGS. 1-8 are schematic cross-sectional illustrations of an example of a technique according to an embodiment of the invention.
Figure 9:
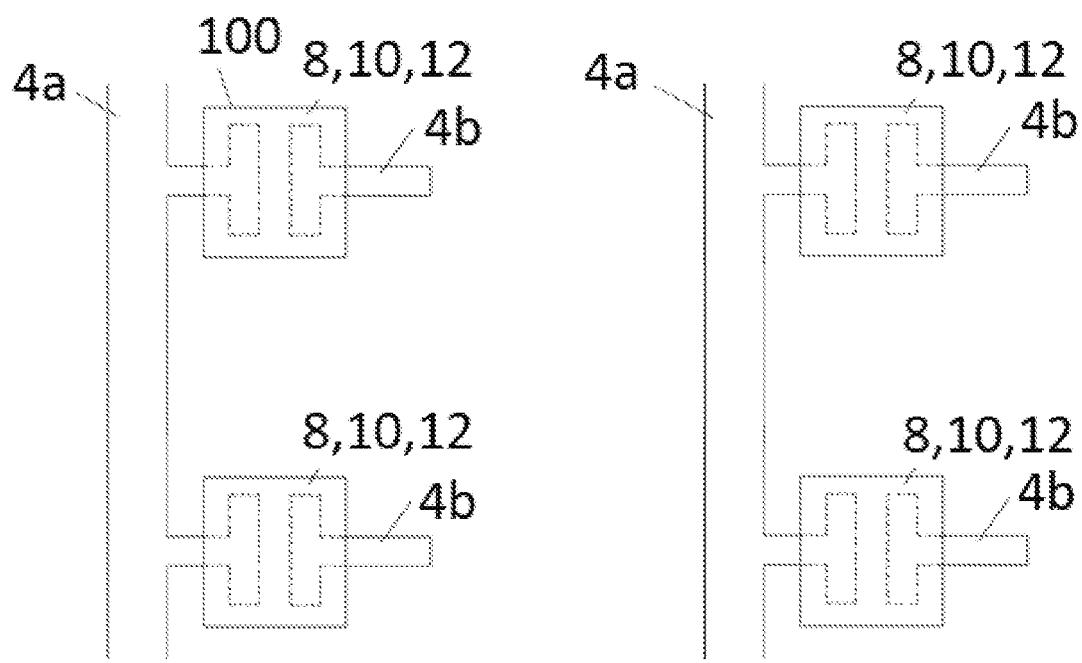
FIGS. 9-11 are schematic plan illustrations to complement FIGS. 1-8.

With reference to FIGS. 1 and 9, the explanation of a technique according to an example embodiment of the present invention begins at the stage of a workpiece comprising a planarised plastics film component 2 supporting: a source-drain conductor pattern 4a, 4b; a transparent conductor pattern 6; a continuous semiconductor layer 8; a continuous interface dielectric layer 10 interfacing the semiconductor layer 8; and a continuous gate dielectric layer 12.

In this example, the plastics film component 2 comprises an ultra-thin plastics support film (such as a 40-micron or 60-micron thickness cellulose triacetate (TAC) film, and may also be supporting one or more functional elements such as a patterned layer configured to shield the semiconductor channels against light incident on the rear surface of the plastics film component 2.

In this example, the source-drain conductor pattern 4a, 4b comprises silver (Ag) and defines at least (i) an array of source conductors 4a each providing the source electrodes for a respective column of TFTs, and each extending outside the array of TFTs; and (ii) an array of drain conductors 4b each associated with a respective pixel electrode (discussed below). Here, the term "source conductor" refers to a conductor connected in series between the semiconductor channel and driver chip/circuitry (not shown), and the term "drain conductor" refers to a conductor connected in series to the driver chip/circuitry via the semiconductor channel.

The transparent conductor pattern 6 is more transparent than the source-drain conductor pattern 4a, 4b in the visible part of the electromagnetic spectrum. In this example, the transparent conductor pattern 6 comprises conductive indium-tin-oxide (ITO). The ITO pattern 6 defines pixel electrodes each contacting a respective drain conductor. The ITO pattern also comprises ITO on at least the whole area of the source and drain conductors, except for areas of the source and drain conductors directly adjacent the semiconductor channels. Retaining ITO on the silver source-drain conductors 4a, 4b serves to protect the silver source-drain conductors 4a, 4b during subsequent processing steps.

In this example, the semiconductor layer 8 comprises an organic conjugated polymer semiconductor. In one example, the semiconductor layer comprises a near amorphous semiconducting polymer with a low degree of energetic disorder. In one example, the semiconductor layer is formed from a product now provided by FlexEnable Limited under the product name FE-S500. In this example, the semiconductor layer 8 is formed by e.g., spin-coating a solution of the semiconductor polymer material. The semiconductor layer 8 defines semiconductor channels between the source and drain conductors in the regions in which the source and drain conductors are in closest proximity. One or more layers (such as a self-assembled monolayer of an organic material) may be formed selectively on the source-drain conductors 4a, 4b to facilitate the transfer of charge carriers between the source-drain conductors 4a, 4b and the semiconductor 6.

In this example, the interface dielectric layer 10 and gate dielectric layer 12 also comprise respective polymers, and are each formed by e.g., spin-coating a solution of the respective dielectric polymer. The gate dielectric polymer 12 material has a higher dielectric constant than the interface dielectric polymer 10, but the interface dielectric polymer 10 is better suited than the gate dielectric polymer 12 to forming a good interface with the semiconductor 8. In this example, the gate dielectric polymer 12 is formed from a cross-linkable dielectric polymer now available from FlexEnable Limited under the product name FE-D048X, but the gate dielectric polymer 12 may also be formed from a non-cross-linkable polymer. In one example, the interface dielectric polymer 10 is formed from the product now provided by FlexEnable Limited under the product name FE-D320.

Figure 2:
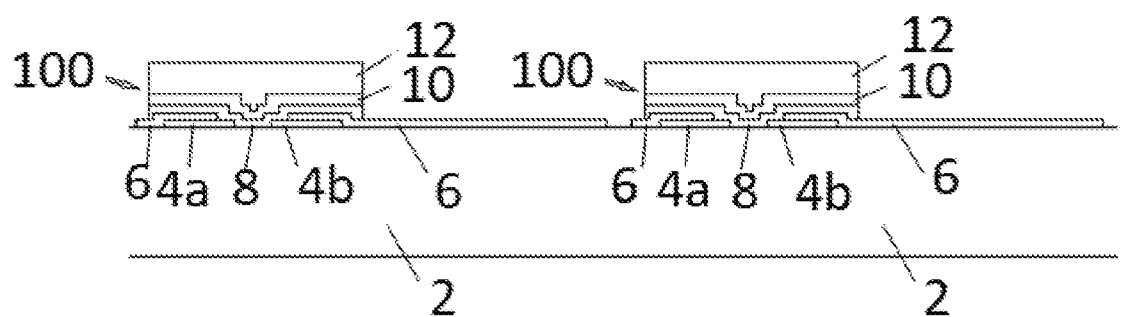

With reference to FIGS. 2 and 9, the workpiece is further processed to achieve patterning of the sub-stack of semiconductor, interface dielectric and gate dielectric layers 8, 10, 12. The patterning defines isolated islands 100, each associated with a respective TFT. In this example, this patterning is done by a photolithographic technique involving: forming a photoresist layer over the gate dielectric layer 12: projecting an image (positive or negative depending on the type of photoresist used) of the pattern desired for the sub-stack, using radiation that induces a change in the solubility of the photoresist, to thereby create a latent solubility pattern in the photoresist layer; developing the latent solubility pattern; and dry-etching the sub-stack using the resulting physical photoresist pattern as a mask.

Figure 3:
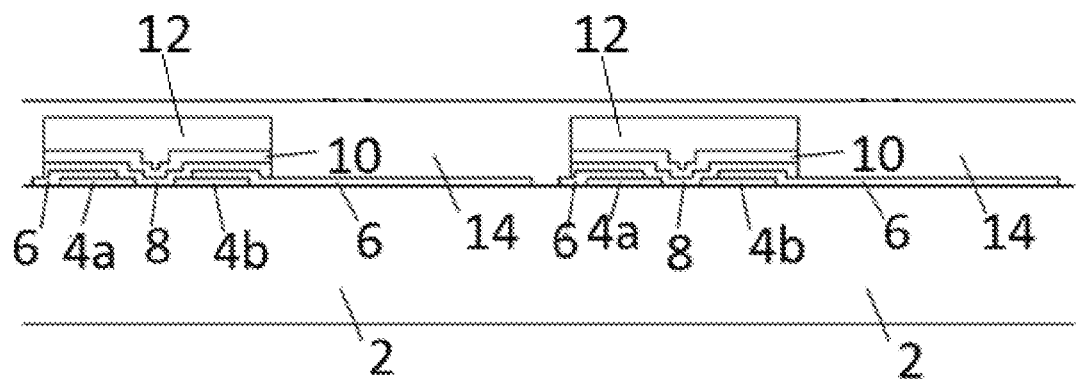

With reference to FIG. 3, the workpiece is further processed by the formation in situ on the upper surface of the workpiece of a continuous insulator layer 14 over at least the whole area of the TFT array (including the area of the above-mentioned islands 100). In this example, the insulator layer 14 is deposited by e.g., spin-coating.

Figure 4:
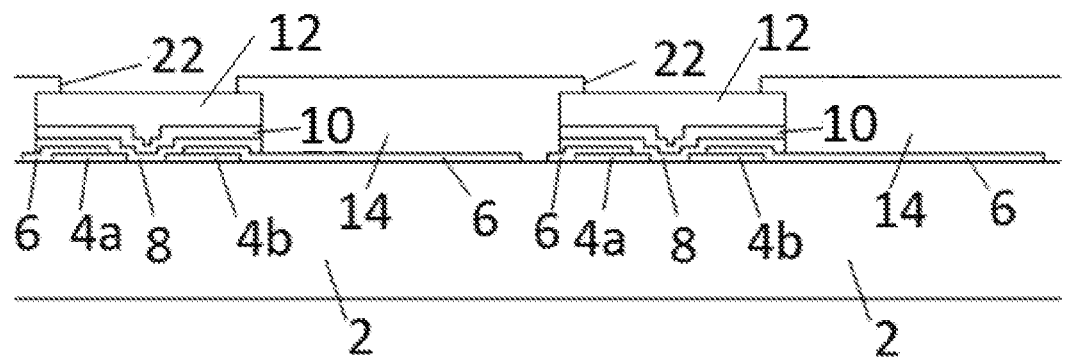
Figure 10:
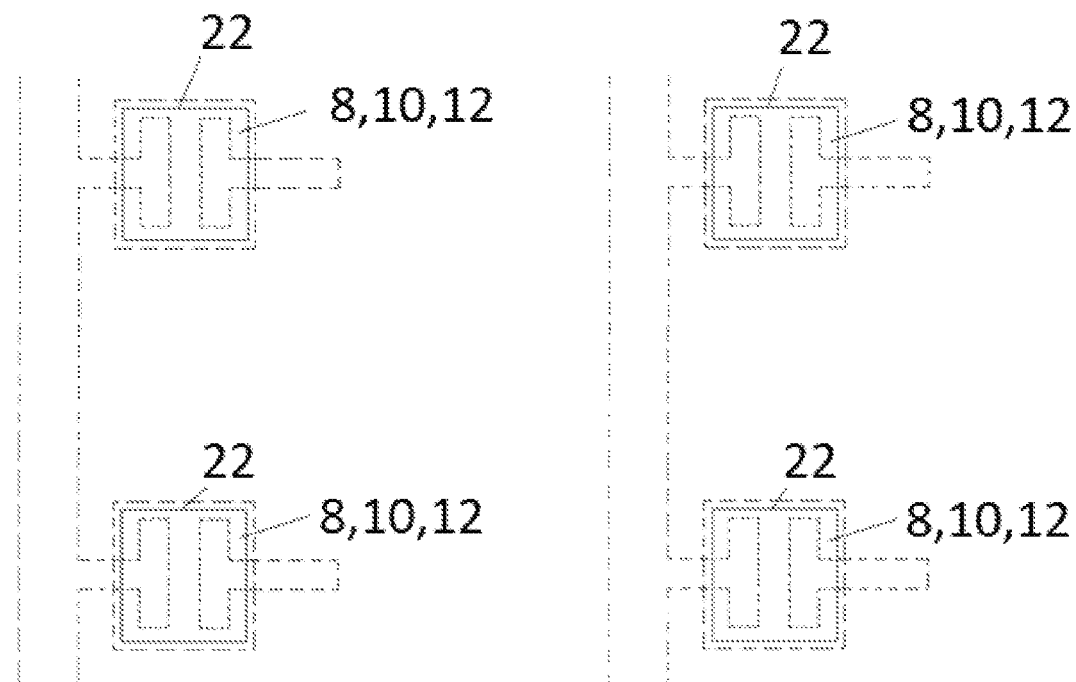

With reference to FIGS. 4 and 10, the workpiece is further processed by patterning the insulator layer 14 to define windows 22, each window exposing the surface of a respective island at least over the whole area of the respective semiconductor channel In this example, the insulator layer 14 is formed by depositing a cross-linkable polymer (such as an epoxy-based cross-linkable polymer, e.g., SU-8 negative photoresist available from MicroChem Corp.); projecting a negative image of the desired window pattern (i.e. positive image of the pattern desired for the insulator layer 14) onto the cross-linkable insulator layer 14, using radiation that induces cross-linking and thereby decreases solubility of the insulator material 14, to create a latent solubility image in the insulator layer 14; and developing the latent solubility image.

Figure 13:
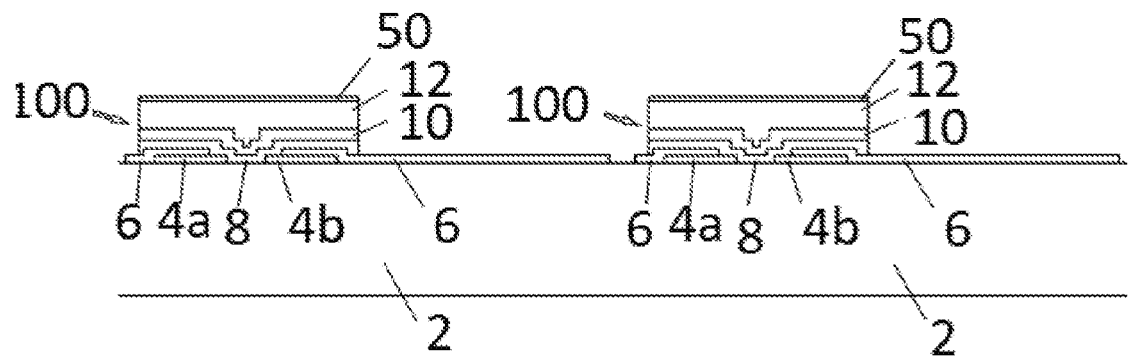
Figure 14:
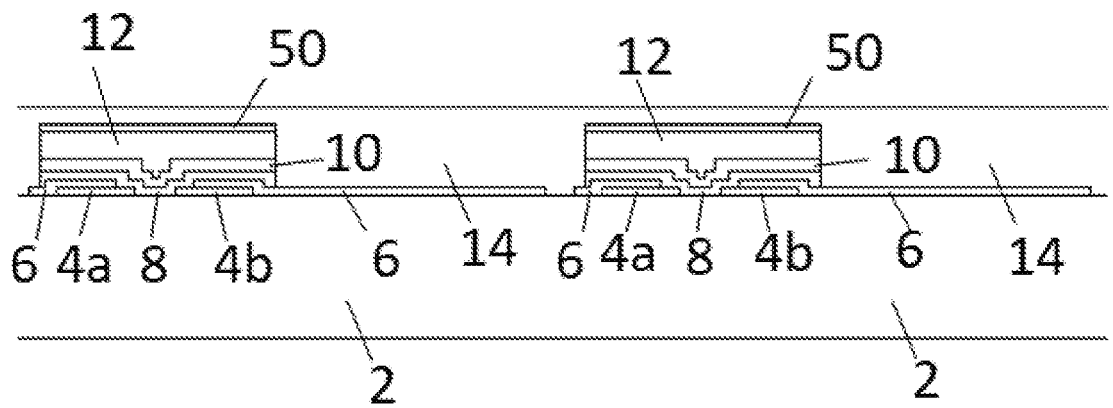
Figure 15:
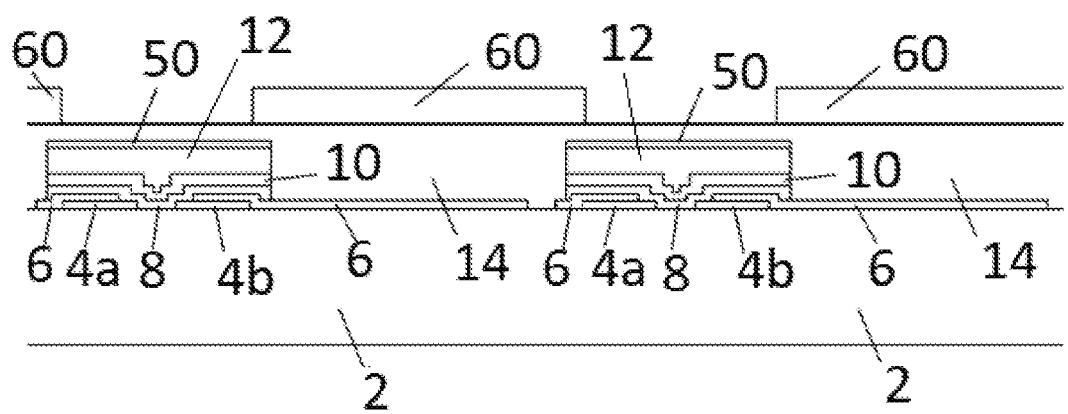
Figure 16:
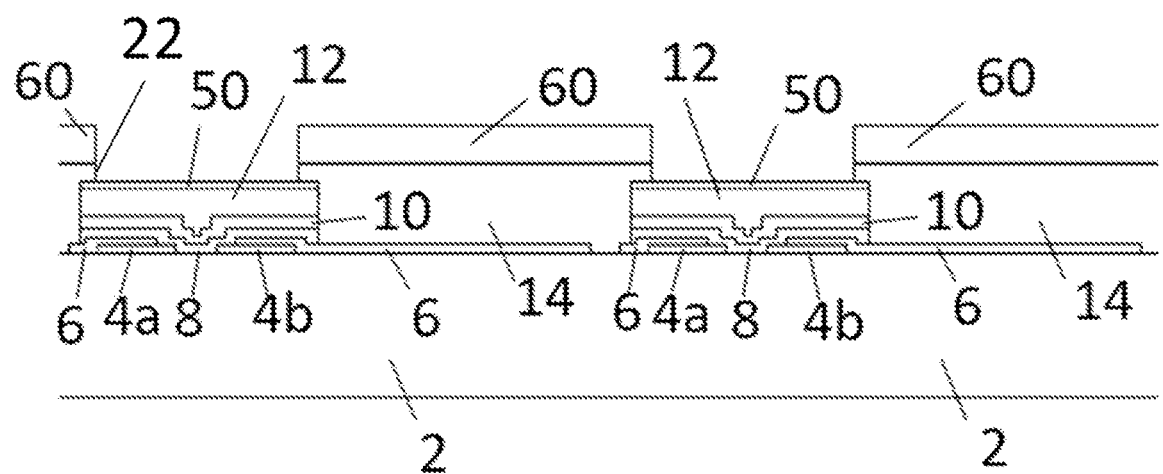
Figure 17:
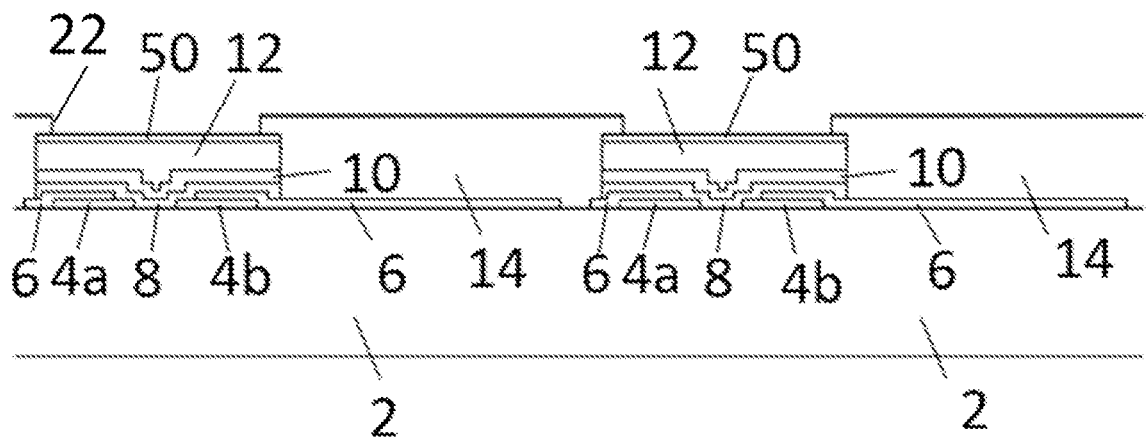
Figure 18:
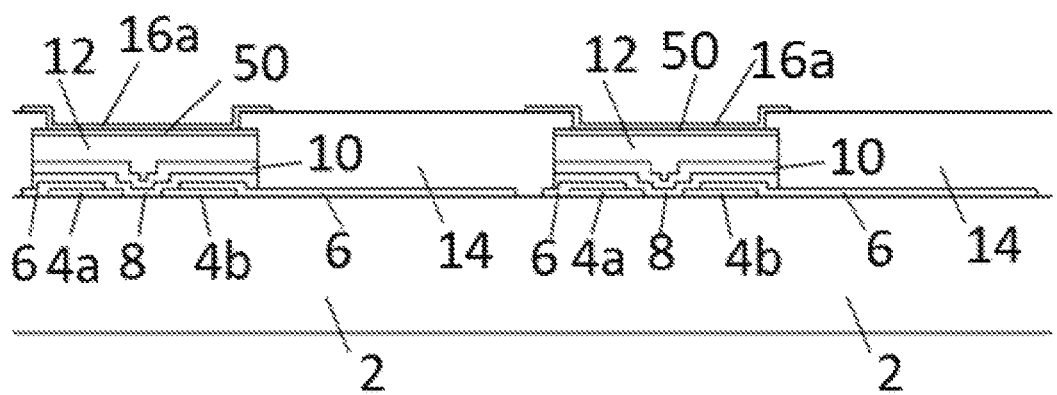

One variation of the technique for patterning the insulator layer 14 is shown in FIGS. 12-18. Before the insulator layer 14 is formed (FIG. 14) (and before the semiconductor/dielectric sub-stack 8, 10, 12 is patterned (FIG. 13)), a continuous dry-etch-stop layer 50 (e.g., ITO layer) is formed in situ on the gate dielectric layer 12 (FIG. 12); and this dry-etch-stop layer 50 and the sub-stack 8, 10, 12 are patterned using the same photoresist mask (FIG. 13). For example, a wet-etching process may be used for removing the dry-etch-stop layer 50 in regions exposed by the photoresist mask, before dry etching the semiconductor/dielectric sub-stack 8, 10, 12 in the same regions exposed by the photoresist mask. This dry-etch-stop layer 50 facilitates the use of dry etching to pattern the insulator layer 14 (using a photoresist mask 60 (FIG. 16) that is removed (FIG. 17) after it has been used to pattern the insulator layer 14). More particularly, the inclusion of the dry-etch-stop layer 50 facilitates removing the full thickness of insulator layer 14 without exposing the gate dielectric 12 to the dry-etching conditions. The use of a dry-etching technique for patterning the insulator layer 14 can provide an upper workpiece surface with a more gradual step in the border regions between inside and outside the window regions 22, and thereby better facilitate the formation (FIG. 18) of gate conductor lines 16a (discussed below) that extend without breaks over the upper surface of the workpiece.

In this example variation, the insulator layer 14 comprises the same negative photoresist material (e.g. SU-8) as in the first example, and the photoresist layer 60 used to pattern the insulator layer 14 comprises a positive photoresist material.

In this example, the sub-stack (8, 10, 12) pattern and the insulator layer 14 pattern are substantially complementary patterns, but the windows 22 are wholly located within the area of the islands 100, such that there is no part of the periphery area of the islands 100 that is not overlapped by the patterned insulator layer 14. As discussed below, this facilitates avoiding exposure of the islands 100 to patterning agents used in later processing.

Figure 5:
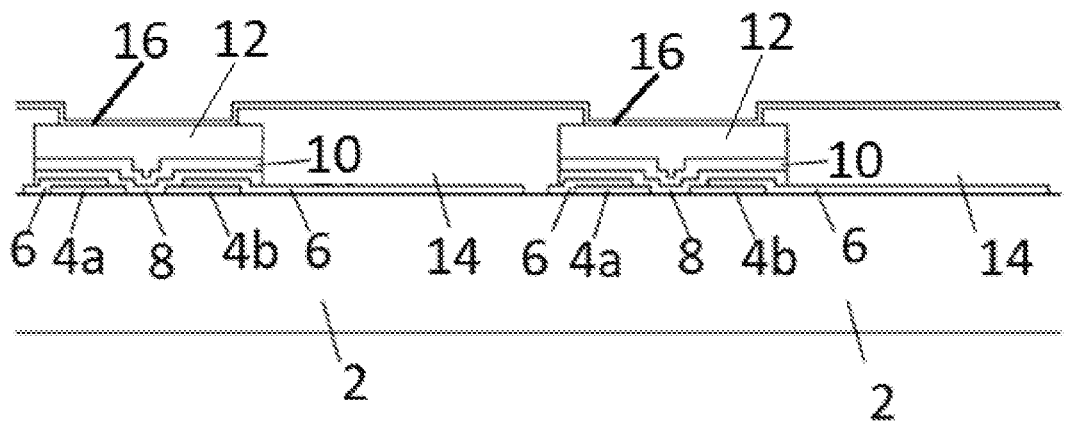

With reference to FIG. 5, the workpiece is further processed by the formation of at least one continuous conductor layer 16 in situ on the upper surface of the workpiece defined together by the gate dielectric layer 12 and the insulator layer 14. The at least one conductor layer 16 is formed continuously over the whole area of the array of TFTs and beyond. In this example, a stack of conductor layers is used, comprising an aluminium (Al) layer sandwiched between two molybdenum (Mo) layers. In this example, each conductor layer is formed in situ on the workpiece by a vapour deposition technique such as e.g. sputtering.

Figure 6:
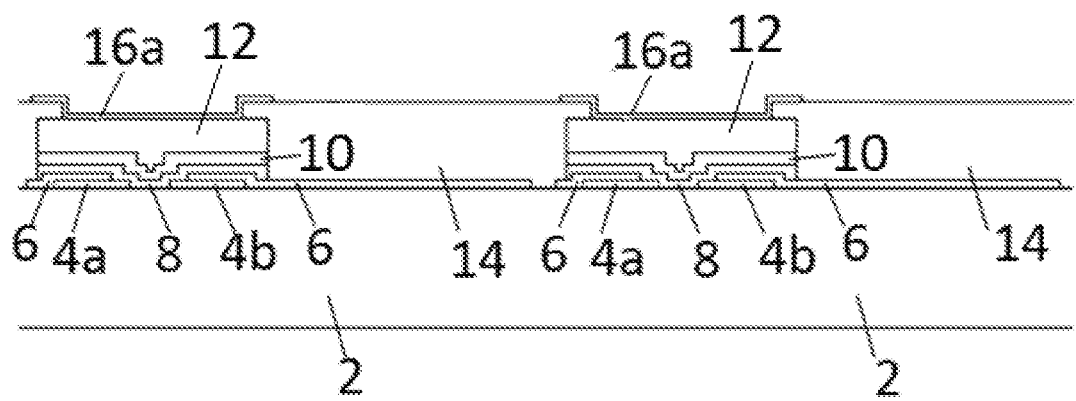
Figure 11:
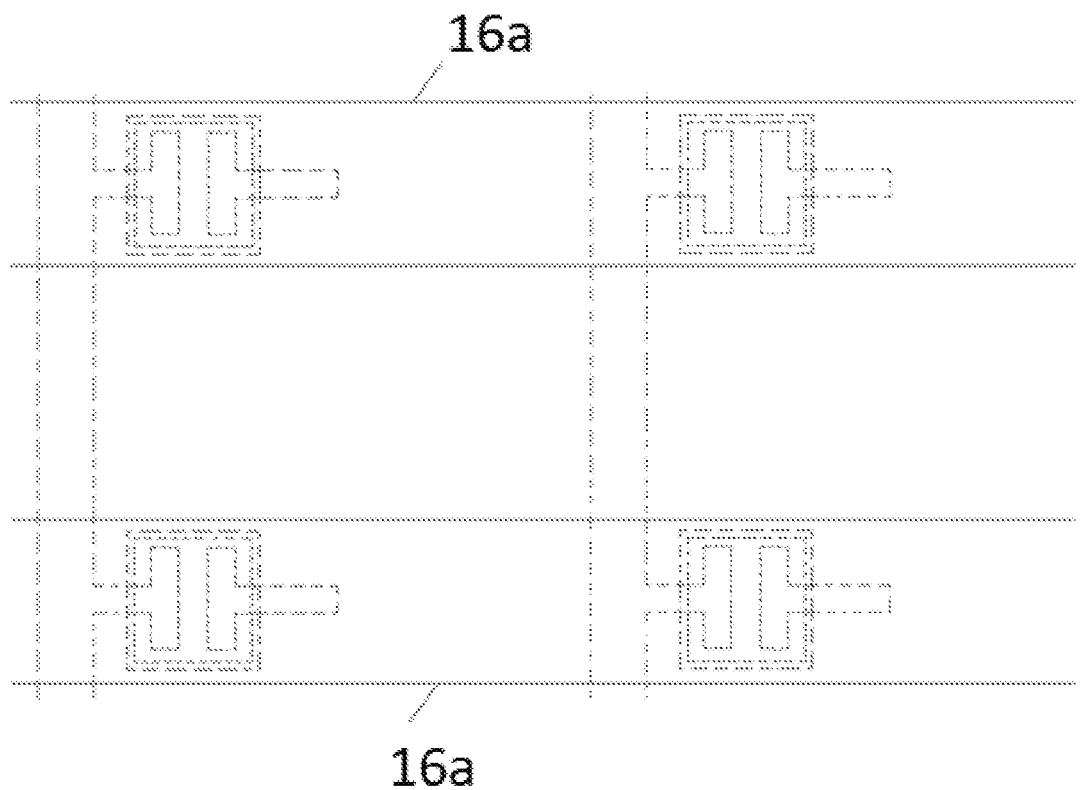
Figure 12:
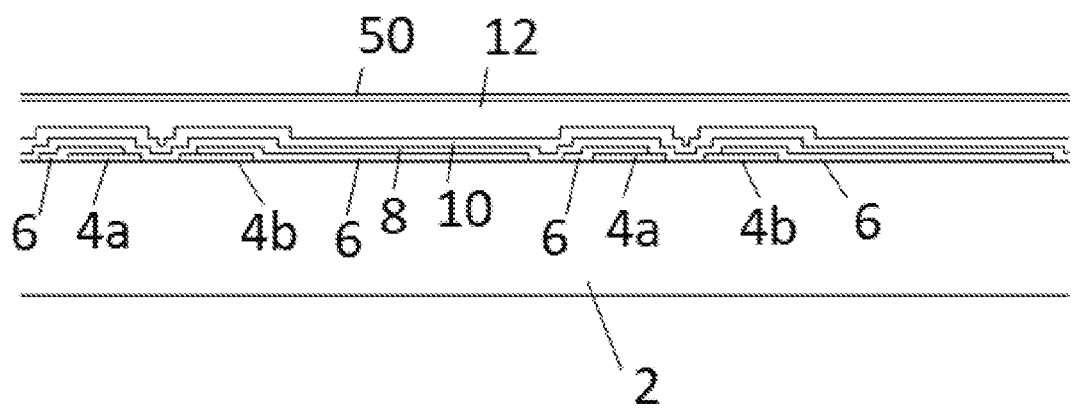
FIGS. 12-18 are schematic cross-section illustrations of an example of an alternative patterning technique for use in the example of FIGS. 1-8.

With reference to FIGS. 6 and 11, the workpiece is further processed to pattern the conductor stack 16, to define gate conductors 16a each providing the gate electrodes for a respective row of transistors, and each extending beyond the edge of the array of TFTs. In this example, this patterning is done by a photolithographic technique comprising: forming a photoresist layer over the conductor stack 16; projecting onto the photoresist an image (positive or negative depending on the type of photoresist used) of the pattern desired for the gate conductors 16a, using radiation that induces a change in the solubility of the photoresist, to create a latent solubility image; developing the latent solubility image; and using the resulting physical pattern in the photoresist as a mask for patterning the conductor stack 16 using one or more patterning agents. In this example, the patterning agent is a wet etchant whose main component is H3PO4. In this example, the insulator layer 14 comprises a material that is less (compared to gate dielectric material 12) susceptible to damage (surface roughening) by this wet etchant and/or less (compared to gate dielectric material 12) permeable to this wet etchant (which lower permeability better protects the underlying source/drain Ag conductor pattern 4a, 4b against being etched by this wet etchant).

As mentioned above, in this example, the upper surface of the insulator layer 14 is higher than the upper surface of the gate dielectric layer 12. This relatively large thickness for the insulator layer 14 can be advantageous for improving dielectric breakdown properties; and the relatively small thickness for the gate dielectric layer 12 can be advantageous for improving capacitance between the gate conductors 16a and the semiconductor channels.

The insulator layer 14 and gate dielectric layer 12 may have different physical and/or chemical properties. For example, the two layers may differ in terms of one or more of the following properties: dielectric constant; layer thickness; etch resistance; adhesion to interfacing layers; density; dielectric breakdown strength; and purity.

In the example described above, both insulator layer 14 and gate dielectric layer 12 are cross-linked layers in the final device; and the method by which cross-linking is achieved in the insulator layer 14 may be different or the same as the method by which cross-linking is achieved in the gate dielectric layer 12.

In this example, the gate conductors 16a are designed so as to extend over at least the whole area of the windows 22, such that the wet etchant never contacts the gate dielectric layer 12.

Furthermore, the insulator layer 14 comprises a material selected for its good (compared to the gate dielectric layer 12) adhesion to at least one or more (and preferably all) of the gate conductor pattern 16a, the source/drain conductor pattern 4a, 4b and the upper surface of the plastics film component 2 (e.g., an organic polymer planarisation layer at the upper surface of the plastics film component 2). For example, good adhesion to the gate conductor pattern 16a better avoids the gate conductor lines 16a lifting off the underlying insulator surface.

Each pixel electrode is associated with a respective unique combination of source and gate conductors, whereby each pixel electrode can be independently addressed via the portions of gate and source conductors outside the array of TFTs.

Figure 7:
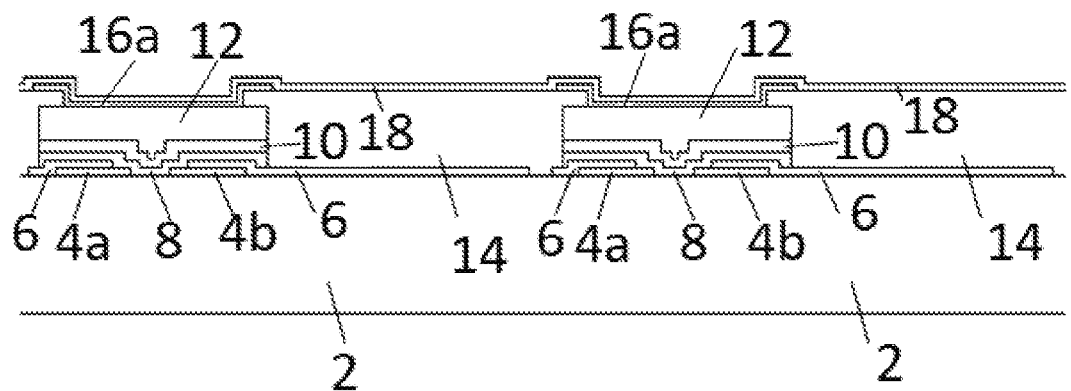
Figure 8:
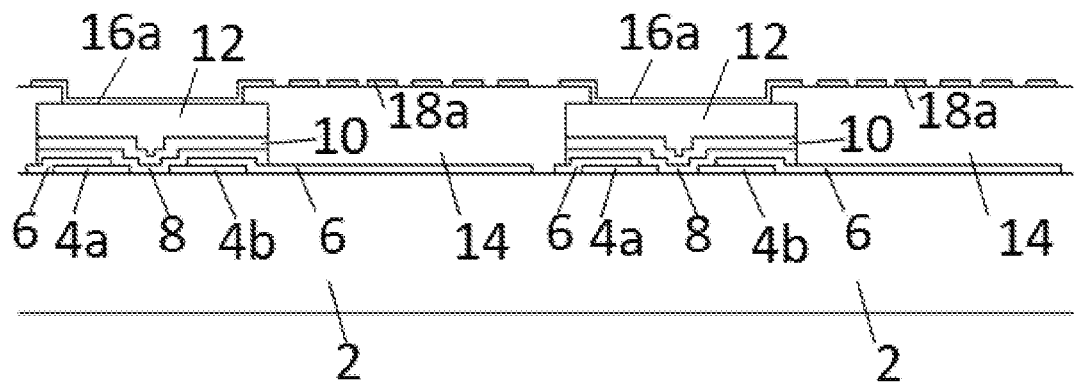

With reference to FIGS. 7 and 8, the workpiece is further processed by the formation of a continuous layer 18 of transparent conductor material (e.g., ITO) in situ on the workpiece, followed by patterning of the continuous layer to define the patterned common electrodes 18a for the FFS liquid crystal device.

The above-described technique facilitates the selection for the gate dielectric layer 12 of a dielectric material optimised for good capacitance and TFT stability, by reducing the demands on the gate dielectric layer 12 for good etchant resistance and good adhesion to interfacing layers.

The inventors for the present application have tested using only non-cross-linked polymers under the ITO layer 18 and have found that this can improve the stability of the TFTs. For example, the inventors for the present application tested (a) using only a single dielectric layer (e.g., using only the interface dielectric layer 10 and omitting the gate dielectric layer 12) between the semiconductor layer 8 and the ITO layer 18, and (b) using a non-cross-linked polymer (e.g., Solvene T provided by Solvay) for the gate dielectric layer 12 in combination with an interface dielectric layer 10 (e.g., FE-D320). For both (a) and (b), a threshold voltage shift of less than 1V was observed in each of a positive gate bias temperature stress (PGBTS) test, a positive bias temperature test (PBTS), a negative gate bias temperature (NGBTS) test, and a negative gate bias stress (NGBS) test.

Figure 19:
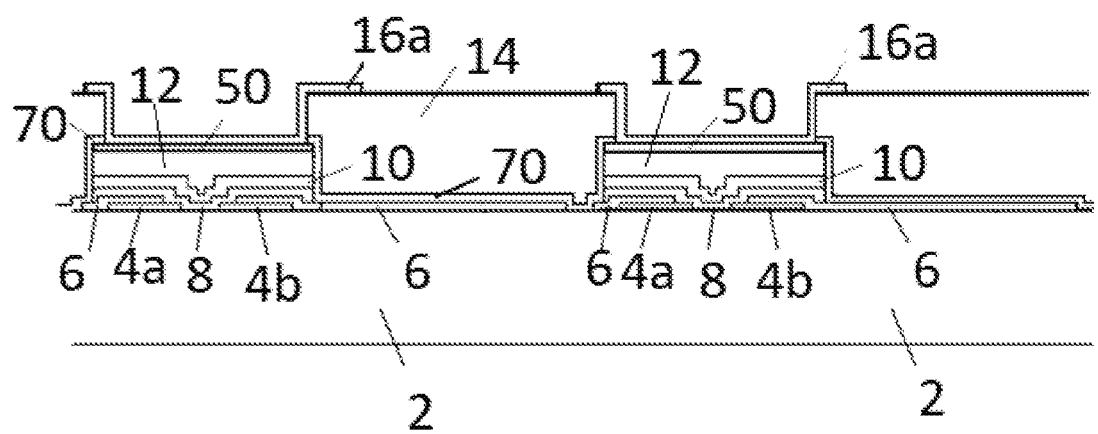
FIG. 19 is a schematic cross-section illustration of another example embodiment.

A third example technique according to another embodiment of the invention is shown in FIG. 19. The third example is the same as the second example FIGS. 12-18, except that an inorganic insulating passivation layer 70 (having a high white-light transmittance) is formed on the upper surface of the workpiece (over at least the whole active area) before formation of the insulator layer (organic planarisation layer) 14. The inorganic insulating layer 70 may, for example, comprise an inorganic nitride or oxide layer, such as e.g., an aluminium nitride (AlNx), an aluminium oxide (AlOx) or a silicon oxide (SiOx). The thickness of the inorganic insulating layer may, for example, be between about 40 nm and 100 nm. The inorganic insulating layer 70 may, for example, be formed by a vapour deposition technique such as e.g. sputtering, chemical vapour deposition (CVD), plasma-enhanced chemical vapour deposition (PECVD) and atomic layer deposition (ALD). The inorganic insulating layer 70 is patterned using the same photoresist etching mask as the insulator layer (organic planarisation layer) 14. The patterning of the inorganic insulating layer 70 may be done by dry etching or wet etching (using an etchant compatible with retention of the underlying ITO layer 50). The inorganic insulating layer 70 acts as an extra gate dielectric layer and can improve yield and reduce the risk of dielectric breakdowns. The inorganic insulating layer 70 also provides further protection for the lower metal pattern against the etchants used to pattern the upper gate metal sub-stack 16.

The variations, additions and process details mentioned for the previous examples are also applicable to this extra example. In particular, the gate dielectric may comprise a single dielectric layer or a stack of dielectric layers.

As mentioned above, examples of techniques according to the present invention have been described in detail above with reference to specific process details, but the technique is more widely applicable within the general teaching of the present application. Additionally, and in accordance with the general teaching of the present invention, a technique according to the present invention may include additional process steps not described above, and/or omit some of the process steps described above.

In addition to any modifications explicitly mentioned above, it will be evident to a person skilled in the art that various other modifications of the described embodiment may be made within the scope of the invention.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features.

What is claimed is:

1. A device, comprising: a stack of layers defining at least: a source-drain conductor pattern at a first level of the stack; and one or more semiconductor channels in respective semiconductor channel regions, connecting a pair of parts of the source-drain conductor pattern, and capacitively coupled via a dielectric to a coupling conductor of a gate conductor pattern at a second level of the stack; wherein the stack comprises: at least two insulator patterns; wherein a first insulator pattern of the at least two insulator patterns occupies at least the one or more semiconductor channel regions to provide the dielectric; and a second insulator pattern of the at least two insulator patterns defines one or more windows in at least the one or more semiconductor channel regions through which the gate conductor pattern contacts the first insulator pattern other than via the insulator pattern;

wherein the second insulator pattern overlaps the first insulator pattern outside the one or more semiconductor channel regions; wherein the gate conductor pattern is formed over the at least two insulator patterns; and the coupling conductor of the gate conductor pattern is formed at least over the whole area of the first insulator pattern.

2. The device according to claim 1, wherein the one or more windows extends over at least the whole area of the respective semiconductor channel region.

3. The device according to claim 1, wherein the first insulator pattern comprises a stack of insulator layers.

4. The device according to claim 1, wherein the gate conductor pattern defines an array of gate conductors, providing the gate electrode for a respective column of the array of transistors, and extending also over the second insulator pattern.

5. The device according to claim 4, wherein the gate conductors adhere better to the surface of the second insulator pattern than to the surface of the first insulator pattern.

6. The device according to claim 4, wherein a semiconductor pattern provides the semiconductor channels, and the semiconductor pattern matches the first insulator pattern.

7. A device comprising a stack of layers defining one or more electronic elements, wherein the stack comprises at least:
   one or more semiconductor channels;
   a dielectric;
   a first conductor pattern defining one or more coupling conductors, wherein the one or more coupling conductors are capacitively coupled to the one or one or more semiconductor channels via the dielectric;
   a planarisation layer;
   a second conductor pattern defining one or more routing conductors, wherein the second conductor pattern is in contact with the first conductor pattern via windows in at least the planarisation layer.

8. The device according to claim 7, wherein the second conductor pattern comprises an etched routing conductor layer.

9. The device according to claim 7, wherein the first conductor pattern comprises a conductive oxide.

10. The device according to claim 7, wherein the first conductor pattern comprises indium tin oxide.

11. The device according to claim 7, wherein the second conductor pattern is a gate conductor pattern.

12. The device according to claim 7, wherein the routing conductors comprise gate conductor lines.

13. The device according to claim 7, wherein the routing conductors provide gate electrodes for a respective row of transistors of an array of transistors, and extend beyond the array of transistors.

14. A device comprising a stack of layers defining one or more electronic elements, wherein the stack comprises at least:
   one or more semiconductor channels;
   a dielectric;
   a conductive oxide pattern defining one or more coupling conductors, wherein the one or more coupling conductors are capacitively coupled to the one or one or more semiconductor channels via the dielectric;
   a planarisation layer;
   a gate conductor pattern defining one or more gate conductor lines, wherein the gate conductor pattern is in contact with the conductive oxide pattern via windows in at least the planarisation layer.

15. The device according to claim 14, wherein the one or more gate conductor lines provide gate electrodes for a respective row of transistors of an array of transistors, and extend beyond the array of transistors.

16. The device according to claim 1, wherein the coupling conductor is a gate conductor line.

17. The device according to claim 16, wherein the gate conductor line provides gate electrodes for a row of transistors of an array of transistors, and extends beyond the array of transistors.

\* \* \* \* \*